United States Patent
Xu et al.

(10) Patent No.: US 11,888,414 B2
(45) Date of Patent: Jan. 30, 2024

(54) DRIVING CIRCUIT AND DRIVING METHOD

(71) Applicant: SILERGY SEMICONDUCTOR TECHNOLOGY (HANGZHOU) LTD, Zhejiang (CN)

(72) Inventors: Zhiwei Xu, Zhejiang (CN); Chiqing Fang, Zhejiang (CN); Chen Zhao, Zhejiang (CN)

(73) Assignee: SILERGY SEMICONDUCTOR TECHNOLOGY (HANGZHOU) LTD, Hangzhou (CN)

( * ) Notice: Subject to any disclaimer, the term of this patent is extended or adjusted under 35 U.S.C. 154(b) by 235 days.

(21) Appl. No.: 17/404,891

(22) Filed: Aug. 17, 2021

(65) Prior Publication Data

US 2022/0060126 A1    Feb. 24, 2022

(30) Foreign Application Priority Data

Aug. 20, 2020  (CN) .......................... 202010841300.8

(51) Int. Cl.
*H02N 2/06* (2006.01)
*H02M 3/07* (2006.01)

(52) U.S. Cl.
CPC ................ *H02N 2/06* (2013.01); *H02M 3/07* (2013.01)

(58) Field of Classification Search
CPC .................................. H02N 2/06; H02M 3/07
See application file for complete search history.

(56) References Cited

U.S. PATENT DOCUMENTS

| 6,944,034 B1* | 9/2005 | Shteynberg | H02M 1/4258 363/21.13 |
| 2008/0212108 A1* | 9/2008 | Shibatani | G02B 6/4227 356/614 |
| 2015/0365000 A1* | 12/2015 | Dhuyvetter | H02M 3/1582 323/271 |

* cited by examiner

Primary Examiner — Zoheb S Imtiaz
(74) Attorney, Agent, or Firm — Harness, Dickey & Pierce, P.L.C.

(57) ABSTRACT

A driving circuit and a driving method are provided. The driving circuit includes a power stage circuit and a full-bridge circuit. The power stage circuit is configured to receive an input voltage, and generate an output voltage at an output port of the power stage circuit. The full-bridge circuit is coupled to the output port of the power stage circuit and is configured to perform charging and discharging on a piezoelectric load. An operating mode of the full-bridge circuit is controlled, so that a supply voltage signal for driving the piezoelectric load during a first operating interval of an operating cycle corresponds to a reference voltage in a first interval, and the supply voltage signal during a second operating interval of the operating cycle corresponds to the reference voltage in a second interval. The driving circuit has a small volume, which is conducive to circuit integration.

21 Claims, 6 Drawing Sheets

DRIVING CIRCUIT AND DRIVING METHOD

The present application claims priority to Chinese Patent Application No. 202010841300.8, titled "DRIVING CIRCUIT AND DRIVING METHOD", filed on Aug. 20, 2020 with the China National Intellectual Property Administration, which is incorporated herein by reference in its entirety.

FIELD

The present disclosure relates to the field of power electronics, and in particular to a driving circuit and a driving method for driving a piezoelectric load.

BACKGROUND

As a piezoelectric load or a piezoelectric actuator, a piezoelectric ceramic is increasingly widely used. The piezoelectric ceramic can convert electrical energy into mechanical energy. For example, a mobile phone vibrates when the piezoelectric ceramic provided therein is driven. A driving circuit for driving the piezoelectric ceramic in the conventional technology generally includes a large number of inductors and capacitors, thereby having a large volume. Moreover, a driving circuit including a large number of inductors is difficult being integrated into a chip, which is not conducive to circuit integration.

SUMMARY

In view of the above, a driving circuit conducive to circuit integration and a driving method are provided according to the present disclosure, to overcome the difficulty in the circuit integration in the conventional technology due to a large number of inductors.

In a first aspect, a driving circuit for driving a piezoelectric load is provided according to an embodiment of the present disclosure. The driving circuit includes a power stage circuit and a full-bridge circuit. The power stage circuit is configured to receive an input voltage, and generate an output voltage at an output port of the power stage circuit. The full-bridge circuit is coupled to the output port of the power stage circuit and is configured to perform charging and discharging on the piezoelectric load. An operating mode of the full-bridge circuit is controlled so that: a supply voltage signal generated by the full-bridge circuit for driving the piezoelectric load during a first operating interval of an operating cycle corresponds to a reference voltage in a first interval; and the supply voltage signal generated during a second operating interval of the operating cycle corresponds to the reference voltage in a second interval.

In an embodiment, the piezoelectric load discharges through the full-bridge circuit reversely during a part of the first operating interval, and the piezoelectric load is charged forward through the full-bridge circuit during another part of the first operating interval.

In an embodiment, the piezoelectric load discharges through the full-bridge circuit forward during a part of the second operating interval, and the piezoelectric load is charged reversely through the full-bridge circuit during another part of the second operating interval.

In an embodiment, the full-bridge circuit includes a first power switch, a second power switch, a third power switch, and a fourth power switch. The first power switch and the second power switch are connected in series between two terminals of the output port of the power stage circuit. The third power switch and the fourth power switch are connected in series between two terminals of the output port of the power stage circuit. The piezoelectric load is connected between a first node and a second node of the output port of the full-bridge circuit, where the first node is a common terminal of the first power switch and the second power switch, and the second node is a common terminal of the third power switch and the fourth power switch.

In an embodiment, during the first operating interval, the second power switch and the third power switch are controlled to be turned off, and an operating mode of the first power switch and an operating mode of the fourth power switch are controlled, so that the supply voltage signal corresponds to the reference voltage in the first interval; and during the second operating interval, the first power switch and the fourth power switch are controlled to be turned off, and an operating mode of the second power switch and an operating mode of the third power switch are controlled, so that the supply voltage signal corresponds to the reference voltage in the second interval.

In an embodiment, during the first operating interval, the second power switch and the third power switch are controlled to be turned off, and the first power switch and the fourth power switch are controlled to operate in a linear mode, so that the supply voltage signal corresponds to the reference voltage in the first interval.

In an embodiment, during the second operating interval, the first power switch and the fourth power switch are controlled to be turned off, and the second power switch and the third power switch are controlled to operate in a linear mode, so that the supply voltage signal corresponds to the reference voltage in the second interval.

In an embodiment, the operating mode of the power stage circuit is controlled during the first operating interval and the second operating interval, so that the output voltage of the power stage circuit maintains at a first voltage.

In an embodiment, during a first part of the first operating interval, the second power switch and the third power switch are controlled to be turned off, and the first power switch and the fourth power switch are controlled to operate in a linear mode, and during a second part of the first operating interval, the second power switch and the third power switch are controlled to be turned off, and the first power switch and the fourth power switch are controlled to be turned on, so that the supply voltage signal during the first operating interval corresponds to the reference voltage in the first interval.

In an embodiment, during a first part of the second operating interval, the first power switch and the fourth power switch are controlled to be turned off, and the second power switch and the third power switch are controlled to operate in a linear mode, and during a second part of the second operating interval, the first power switch and the fourth power switch are controlled to be turned off, and the second power switch and the third power switch are controlled to be turned on, so that the supply voltage signal during the second operating interval corresponds to the reference voltage in the second interval.

In an embodiment, an operating mode of the power stage circuit is controlled during the second part of the first operating interval and the second part of the second operating interval, so that the output voltage of the power stage circuit serves as the supply voltage signal.

In an embodiment, the reference voltage in the first interval is a rising part of the reference voltage in a cycle, and the reference voltage in the second interval is a falling part of the reference voltage in the cycle.

In an embodiment, the reference voltage is an alternating current voltage.

In an embodiment, a waveform of the reference voltage is a sine wave.

In an embodiment, the driving circuit further includes an energy storage capacitor. The energy storage capacitor is coupled to the output port of the power stage circuit. The energy storage capacitor is configured to store the output voltage of the power stage circuit.

In an embodiment, the number of the full-bridge circuit is N. The N full-bridge circuits are connected in parallel between two terminals of the output port of the power stage circuit. The N full-bridge circuits are configured to provide supply voltage signals for N piezoelectric loads respectively, where N is greater than or equal to 1.

In an embodiment, the driving circuit further includes a control circuit. The control circuit is configured to generate a first driving voltage and a second driving voltage based on a compensation signal, to control the operating modes of the first power switch, the second power switch, the third power switch, and the fourth power switch. The compensation signal indicates an error between the reference signal and a sampling signal characterizing the supply voltage signal.

In an embodiment, the control circuit includes a first control circuit configured to generate the first driving voltage and a second control circuit configured to generate the second driving voltage.

During the first operating interval, the first control circuit generates the first driving voltage based on the compensation signal, to control turn-on resistance of the first power switch and turn-on resistance of the fourth power switch, and the second control circuit controls the second driving voltage to be invalid to control the second power switch and the third power switch to be turned off. During the second operating interval, the first control circuit controls the first driving voltage to be invalid, to control the first power switch and the fourth power switch to be turned off, and the second control circuit generates the second driving voltage based on the compensation signal, to control turn-on resistance of the second power switch and turn-on resistance of the third power switch.

In an embodiment, the power stage circuit is one of a buck circuit, a boost circuit, a flyback circuit, a forward circuit, a boost-buck circuit, and a buck-boost circuit.

In a second aspect, a driving method is provided according to the present disclosure. The driving method is applicable to a driving circuit. The driving circuit includes: a power stage circuit for receiving an input voltage, and generating an output voltage at an output port of the power stage circuit; and a full-bridge circuit coupled to the output port of the power stage circuit and for charging and discharging a piezoelectric load.

The driving method includes: controlling an operating mode of the full-bridge circuit to control: a supply voltage signal generated by the full-bridge circuit for driving the piezoelectric load during a first operating interval of an operating cycle to correspond to a reference voltage in a first interval; and the supply voltage signal during a second operating interval of the operating cycle to correspond to the reference in a second interval.

Compared with the conventional technology, the technical solutions according to the present disclosure have the following advantages. The driving circuit according to the present disclosure includes a power stage circuit and a full-bridge circuit. The power stage circuit is configured to receive an input voltage, and generate an output voltage at an output port of the power stage circuit. The full-bridge circuit is coupled to the output port of the power stage circuit and is configured to perform charging and discharging on a piezoelectric load. An operating mode of the full-bridge circuit is controlled, so that a supply voltage signal generated by the full-bridge circuit for driving the piezoelectric load during a first operating interval of an operating cycle corresponds to a reference voltage in a first interval, and the supply voltage signal generated during a second operating interval of the operating cycle corresponds to the reference voltage in a second interval. The reference voltage is an alternating current voltage. In an embodiment, the reference voltage in the first interval refers to a rising part of the reference voltage in a cycle, and the reference voltage in the second interval refers to a falling part of the reference voltage in the cycle. In an embodiment, a waveform of the reference voltage is a sine wave. According to the present disclosure, the operating mode of the full-bridge circuit is controlled based on the reference voltage, so that the supply voltage signal changes with the reference voltage. No inductor is coupled to the full-bridge circuit in the driving circuit according to the present disclosure, so that a volume of the driving circuit is reduced, which is thereby conducive to circuit integration.

BRIEF DESCRIPTION OF THE DRAWINGS

The above and other objects, features and advantages of the present disclosure are clearer from the following description of embodiments of the present disclosure with reference to the drawings. In the drawings.

DETAILED DESCRIPTION

Figure 1:
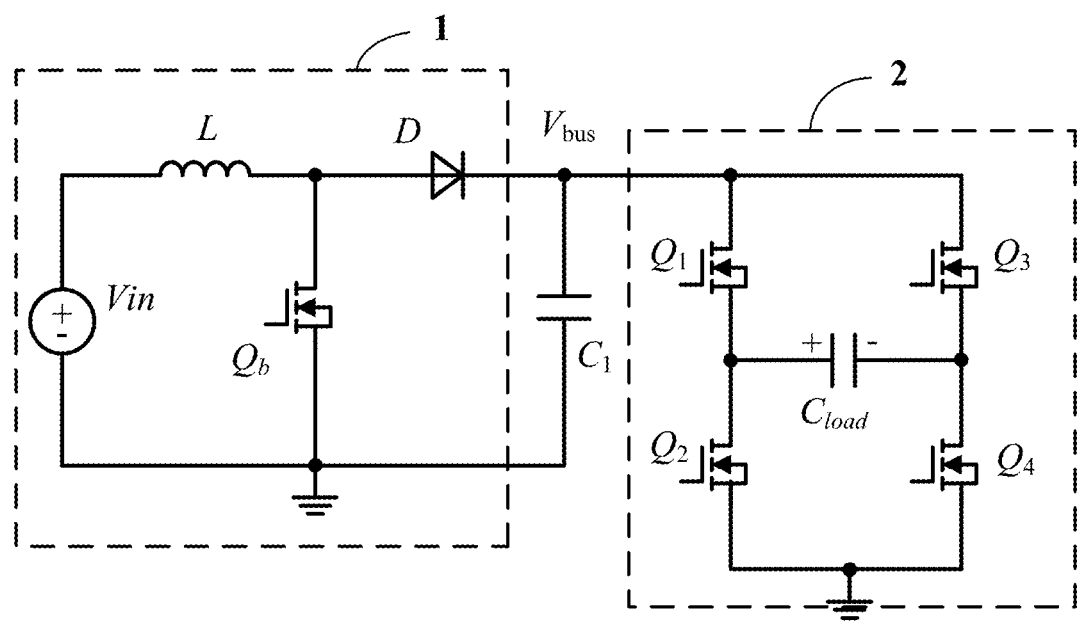
FIG. 1 is a schematic diagram showing a first example driving circuit according to the embodiments of the present disclosure.

The present disclosure is described below based on embodiments. However, the present disclosure is not limited to these embodiments. In the following detailed description of the present disclosure, some specific details are described. Those skilled in the art can fully understand the present disclosure without the description of these details. Well-known methods, processes, flows, components and circuits are not described in detail in order to avoid obscuring the essence of the present disclosure.

In addition, those skilled in the art should understand that the drawings provided herein are for illustrative purpose, and are unnecessarily drawn to scale.

In addition, it should be understood that in the following description, a "circuit" refers to a conductive loop formed by at least one element or sub-circuit through electrical connection or electromagnetic connection. In a case where an element or circuit is described as "being connected to" another element or "being connected between" two nodes, the element or circuit is coupled or connected to another element directly or via other element. A connection between the elements may be physical, logical, or a combination thereof. In addition, in a case where an element is described as "being directly coupled to" or "directly connected to" another element, there is no element between the two elements.

A driving circuit for driving a piezoelectric load is provided according to an embodiment of the present disclosure. The driving circuit includes a power stage circuit and a full-bridge circuit.

The power stage circuit is configured to receive an input voltage and generate an output voltage at an output port of the power stage circuit.

The full-bridge circuit is coupled to the output port of the power stage circuit, and is configured to perform charging and discharging on the piezoelectric load.

An operating mode of the full-bridge is controlled, so that a supply voltage signal generated by the full-bridge circuit for driving the piezoelectric load during a first operating interval of an operating cycle corresponds to a reference voltage in a first interval, and the supply voltage signal generated during a second operating interval of the operating cycle corresponds to the reference voltage in a second interval.

The reference voltage in the first interval is a rising part of the reference voltage in a cycle, and the reference voltage in the second interval is a falling part of the reference voltage in the cycle. In an embodiment, the reference voltage is implemented by an alternating current signal. In an embodiment, a waveform of the reference voltage is a sine wave.

The power stage circuit is a buck circuit, a boost circuit, a flyback circuit, a forward circuit, a boost-buck circuit, a buck-boost circuit, or the like.

In an embodiment, the driving circuit includes N full-bridge circuits. The N full-bridge circuits are connected in parallel with the output port of the power stage circuit. The N full-bridge circuits are configured to provide supply voltage signals for N piezoelectric loads so as to drive the N piezoelectric loads, respectively. N is greater than or equal to 1.

The piezoelectric load according to the present disclosure includes a piezoelectric device such as a piezoelectric ceramic or a piezoelectric actuator. A power switch and a selector switch in the present disclosure are not only implemented by a metal oxide semiconductor (MOS) transistor, but also implemented by a bipolar junction transistor (BJT) or an insulated gate bipolar transistor (IGBT), which is not limited in the present disclosure. A control principle of the driving circuit according to the present invention is to control the operating mode of the full-bridge circuit based on the reference voltage, so that the supply voltage signal changes with the reference voltage, that is, the reference voltage is an expected value of the supply voltage signal. Specifically, the operating mode of the full-bridge circuit is controlled so that a supply voltage signal generated by the full-bridge circuit for driving the piezoelectric load during a first operating interval of an operating cycle corresponds to a reference voltage in a first interval, and the supply voltage signal generated during a second operating interval of the operating cycle corresponds to the reference voltage in a second interval. The reference voltage in the first interval is a rising part of the reference voltage in a cycle, and the reference voltage in the second interval is a falling part of the reference voltage in the cycle. In an embodiment, the reference voltage is implemented by an alternating current signal. A waveform of the reference voltage is preferably a sine wave. The following description of embodiments of the present disclosure is made with an example where the reference voltage has a sine waveform. However, the reference voltage may be in another form, which is not limited herein. The full-bridge circuit in the driving circuit according to the present disclosure is coupled to no inductor, so that a volume of the driving circuit is reduced, which is thereby conducive to circuit integration. With the driving circuit according to the present disclosure, the number of piezoelectric loads to be driven is increased easily, and the piezoelectric loads are driven separately. Therefore, the driving circuit is configured to drive one or more piezoelectric loads. For ease of illustration, the following embodiments are described with an example of two piezoelectric loads, which is not limited thereto. The driving circuit according to the present disclosure is implemented through a simple process, and includes fewer devices, so that the volume of the driving circuit is reduced, cost for the driving circuit is reduced, and power density of the driving circuit is improved.

FIG. 1 is a schematic diagram showing a first example driving circuit according to the embodiments of the present disclosure. The driving circuit is configured to provide a supply voltage signal to a piezoelectric load $C_{load}$, for example, a piezoelectric actuator, so as to drive the piezoelectric load $C_{load}$. The driving circuit includes a power stage circuit 1 and a full-bridge circuit 2. The power stage circuit 1 is configured to receive an input voltage $V_{in}$ and generate an output voltage $V_{bus}$ at an output port of the power stage circuit 1. The full-bridge circuit 2 is coupled to the output port of the power stage circuit 1 and is configured to perform charging and discharging on the piezoelectric load $C_{load}$. An operating mode of the full-bridge circuit 2 is controlled, so that the supply voltage signal generated by the full-bridge circuit for driving the piezoelectric load $C_{load}$ during a first operating interval of an operating cycle corresponds to a reference voltage in a first interval, and the supply voltage signal generated during a second operating interval of the operating cycle corresponds to a reference voltage in a second interval. In this embodiment, a waveform of the reference voltage is a sine wave. The reference voltage in the first interval is a rising part of the reference voltage in a cycle, and the reference voltage in the second interval is a falling part of the reference voltage in the cycle.

Further, the piezoelectric load $C_{load}$ discharges through the full-bridge circuit 2 reversely during a part of the first operating interval, and the piezoelectric load $C_{load}$ is charged forward through the full-bridge circuit 2 during another part of the first operating interval. Further, the piezoelectric load $C_{load}$ discharges through the full-bridge circuit 2 forward during a part of the second operating interval, and the piezoelectric load $C_{load}$ is charged reversely through the full-bridge circuit 2 during another part of the second operating interval.

The full-bridge circuit 2 includes a first power switch $Q_1$, a second power switch $Q_2$, a third power switch $Q_3$, and a fourth power switch $Q_4$. The first power switch $Q_1$ and the second power switch $Q_2$ are connected in series between two terminals of the output port of the power stage circuit 1. The third power switch $Q_3$ and the fourth power switch $Q_4$ are connected in series between two terminals of the output port of the power stage circuit 1. The piezoelectric load $C_{load}$ is connected between a first node and a second node, where the first node is a common terminal of the first power switch $Q_1$ and the second power switch $Q_2$, and the second node is a common terminal of the third power switch $Q_3$ and the fourth power switch $Q_4$. In an embodiment, a positive terminal of the piezoelectric load $C_{load}$ is connected to the first node, and a negative terminal of the piezoelectric load $C_{load}$ is connected to the second node, which is not limited thereto. Furthermore, the supply voltage signal is represented as a voltage difference between the first node and the second node. The voltage difference is equal to or approximates to a voltage difference between two terminals of the piezoelectric load $C_{load}$.

The driving circuit according to this embodiment further includes a control circuit (not shown in FIG. 1). The control circuit is configured to: during the first operating interval, control the second power switch $Q_2$ and the third power switch $Q_3$ to be turned off, and control operating modes of the first power switch $Q_1$ and the fourth power switch $Q_4$ so that the supply voltage signal corresponds to the reference voltage in the first interval; and during the second operating interval, control the first power switch $Q_1$ and the fourth power switch $Q_4$ to be turned off, and control operating modes of the second power switch $Q_2$ and the third power switch $Q_3$ so that the supply voltage signal corresponds to the reference voltage in the second interval.

There are various control manners for the above-mentioned objects. Two specific control manners are described below, but the present disclosure is not limited thereto.

In a first control manner, during the first operating interval, the second power switch $Q_2$ and the third power switch $Q_3$ are controlled to be turned off, and the first power switch $Q_1$ and the fourth power switch $Q_4$ are controlled to operate in a linear mode, so that the supply voltage signal corresponds to the reference voltage in the first interval. During the second operating interval, the first power switch $Q_1$ and the fourth power switch $Q_4$ are controlled to be turned off, and the second power switch $Q_2$ and the third power switch $Q_3$ are controlled to operate in a linear mode, so that the supply voltage signal corresponds to the reference voltage in the second interval. Specifically, during the first operating interval, a driving voltage for the first power switch $Q_1$ and a driving voltage for the fourth power switch $Q_4$ are controlled, and such that turn-on resistance of the first power switch $Q_1$ and turn-on resistance of the fourth power switch $Q_4$ are controlled, so that the supply voltage signal corresponds to the reference voltage in the first interval. During the second operating interval, a driving voltage for the second power switch $Q_2$ and a driving voltage for the third power switch $Q_3$ are controlled, and such that turn-on resistance of the second power switch $Q_2$ and turn-on resistance of the third power switch $Q_3$ are controlled, so that the supply voltage signal corresponds to the reference voltage in the second interval. Furthermore, the driving voltage for the first power switch $Q_1$ and the driving voltage for the fourth power switch $Q_4$ are the same or different from each other during the first operating interval. The driving voltage for the second power switch $Q_2$ and the driving voltage for the third power switch $Q_3$ are the same or different from each other during the second operating interval, which is not limited in the present disclosure. For ease of description, the following description is made with an example where the driving voltages for the first power switch $Q_1$ is the same as the driving voltage for the fourth power switch $Q_4$, and the driving voltage for the second power switch $Q_2$ is the same as the driving voltage for the third power switch $Q_3$. Furthermore, the power stage circuit 1 is controlled, during the first operating interval and the second operating interval, to operate in a PWM mode and therefore maintain an output voltage $V_{bus}$ to be equal to a first voltage $V_1$. The first voltage $V_1$ refers to a stable output voltage $V_{bus}$ of the power stage circuit 1.

In a second control manner, during a first part of the first operating interval, the second power switch $Q_2$ and the third power switch $Q_3$ are controlled to be turned off, and the first power switch $Q_1$ and the fourth power switch $Q_4$ are controlled to operate in a linear mode, and during a second part of the first operating interval, the second power switch $Q_2$ and the third power switch $Q_3$ are controlled to be turned off, and the first power switch $Q_1$ and the fourth power switch $Q_4$ are controlled to be turned on, so that the supply voltage signal during the first operating interval corresponds to the reference voltage in the first interval. During a first part of the second operating interval, the first power switch $Q_1$ and the fourth power switch $Q_4$ are controlled to be turned off, and the second power switch $Q_2$ and the third power switch $Q_3$ are controlled to operate in a linear mode, and during a second part of the second operating interval, the first power switch $Q_1$ and the fourth power switch $Q_4$ are controlled to be turned off, and the second power switch $Q_2$ and the third power switch $Q_3$ are controlled to be turned on, so that the supply voltage signal in the second operating interval corresponds to the reference voltage in the first interval. During the second part of the first operating interval and the second part of the second operating interval, the power stage circuit 1 is controlled to operate in the PWM mode to generate the output voltage $V_{bus}$ which serves as the supply voltage signal. That is, the output voltage $V_{bus}$ corresponds to the reference voltage in such intervals. Specifically, a duty cycle of a power switch in the power stage circuit 1 is controlled during such intervals so that the output voltage $V_{bus}$ corresponds to the reference voltage in the intervals. During the first part of the first operating interval and the first part of the second operating interval, the power stage circuit 1 does not operate, and the power switch in the power stage circuit 1 is controlled to operate in a linear mode. By controlling a driving voltage for the power switch, turn-on resistance of the power switch is controlled so that the supply voltage signal corresponds to the reference voltage in these intervals.

In this embodiment, the power stage circuit 1 is a boost circuit and includes a power switch $Q_b$, a diode D and an inductor L. The power switch $Q_b$ and the inductor L are connected in series between two ends of an input power supply. A common terminal of the power switch $Q_b$ and the input power source is grounded. A first terminal of the diode D is connected to a common terminal of the inductor L and the power switch $Q_b$, and a second terminal of the diode D serves as a high potential terminal of the output port of the power stage circuit 1. A low potential terminal of the output port of the power stage circuit 1 is grounded. Since the voltage at the low potential terminal of the output port of the power stage circuit 1 is regarded as zero, the voltage at the high potential terminal of the output port of the power stage circuit 1 is the voltage at the output port of the power stage circuit 1. The input power supply is configured to provide an input voltage $V_{in}$. In some embodiments, the diode D is replaced by a power switch. In some embodiments, the power stage circuit is a buck circuit, a flyback circuit, a forward circuit, a boost-buck circuit, a buck-boost circuit, or any other power stage circuit of another topology, which is not limited herein.

Corresponding to the first control manner, the output port of the power stage circuit 1 may or may not be coupled with an energy storage capacitor. In an embodiment, the driving circuit further includes an energy storage capacitor $C_1$. The energy storage capacitor $C_1$ is coupled to the output port of the power stage circuit 1, and is configured to store the first voltage $V_1$, so that the voltage at the output port of the power stage circuit 1 remains unchanged. In another embodiment, no energy storage capacitor is coupled to the output port of the power stage circuit 1, and the output voltage of the power stage circuit 1 directly charges the piezoelectric load $C_{load}$ via the full-bridge circuit 2, thereby reducing power loss. Corresponding to the second control manner, no energy storage capacitor is coupled to the output port of the power stage circuit 1.

Figure 4:
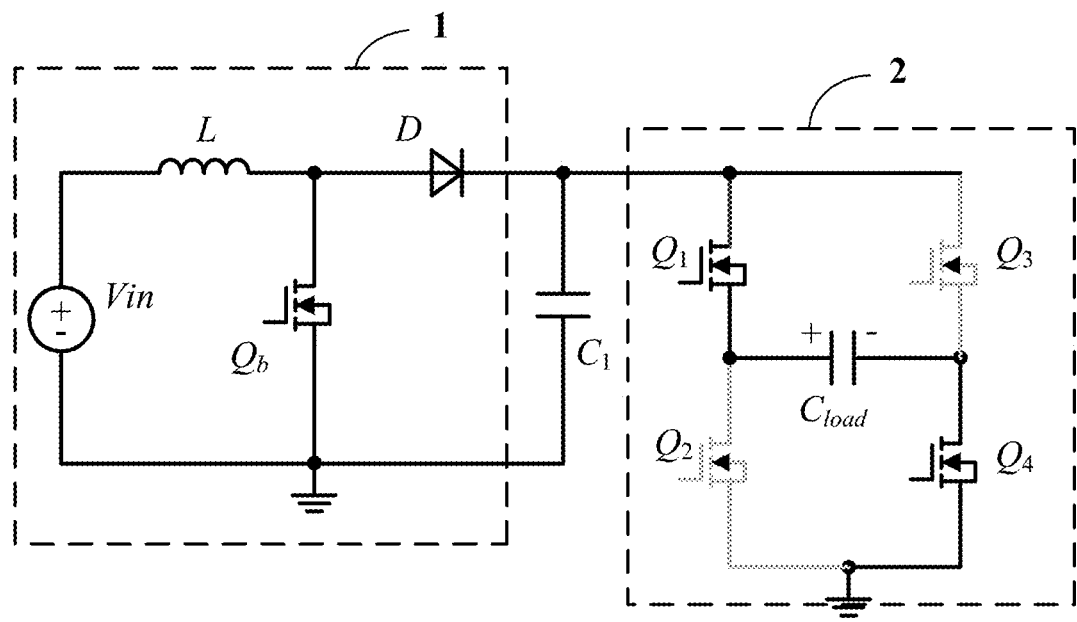
FIG. 4 is a schematic diagram showing an operating mode of the first example driving circuit during a first operating interval according to the embodiments of the present disclosure.
Figure 5:
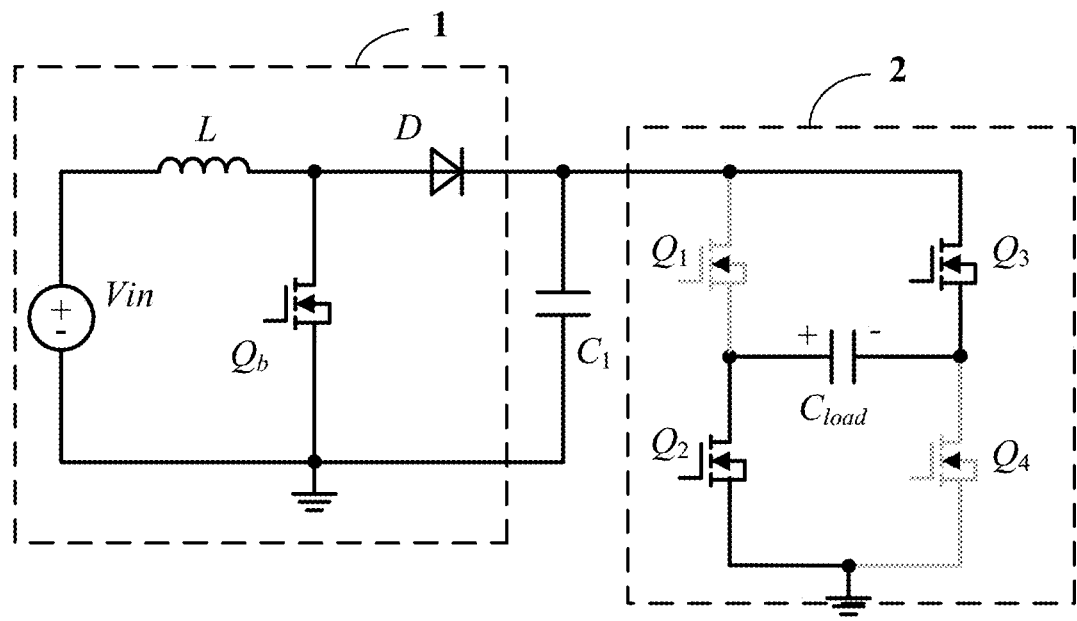
FIG. 5 is a schematic diagram showing an operating mode of the first example driving circuit during a second operating interval according to the embodiments of the present disclosure.

An operating process of the driving circuit according to the first embodiment controlled in the first control manner is illustrated with reference to FIG. 2, FIG. 4 and FIG. 5. $V_{bus}$ represents the voltage stored in the energy storage capacitor $C_1$ (where in an embodiment without an energy storage capacitor $C_1$, $V_{bus}$ represents the voltage at the output port of the power stage circuit 1). First voltage $V_1$ represents the voltage after the voltage $V_{bus}$ stored in the energy storage capacitor $C_1$ is stable (where in an embodiment without the energy storage capacitor $C_1$, first voltage $V_1$ represents the voltage after the voltage $V_{bus}$ at the output port of the power stage circuit 1 is stable). For ease of description, the following description is made with an embodiment including an energy storage capacitor $C_1$, and the present disclosure is not limited thereto. $V_{ref}$ represents the reference voltage, whose waveform is a sine wave. $V_{gQ1}$ represents a driving signal for the first power switch $Q_1$, $V_{gQ2}$ represents a driving signal for the second power switch $Q_2$, $V_{gQ3}$ represents a driving signal for the third power switch $Q_3$, and $V_{gQ4}$ represents a driving signal for the fourth power switch $Q_4$. $V_{load}$ represents a voltage difference between two terminals of the piezoelectric load $C_{load}$ (where in this embodiment, $V_{load}$ represents difference obtained by subtracting the voltage at a negative terminal of the piezoelectric load from the voltage at a positive terminal of piezoelectric load). The voltage difference between two terminals of the piezoelectric load $C_{load}$ characterizes the supply voltage signal.

Figure 2:
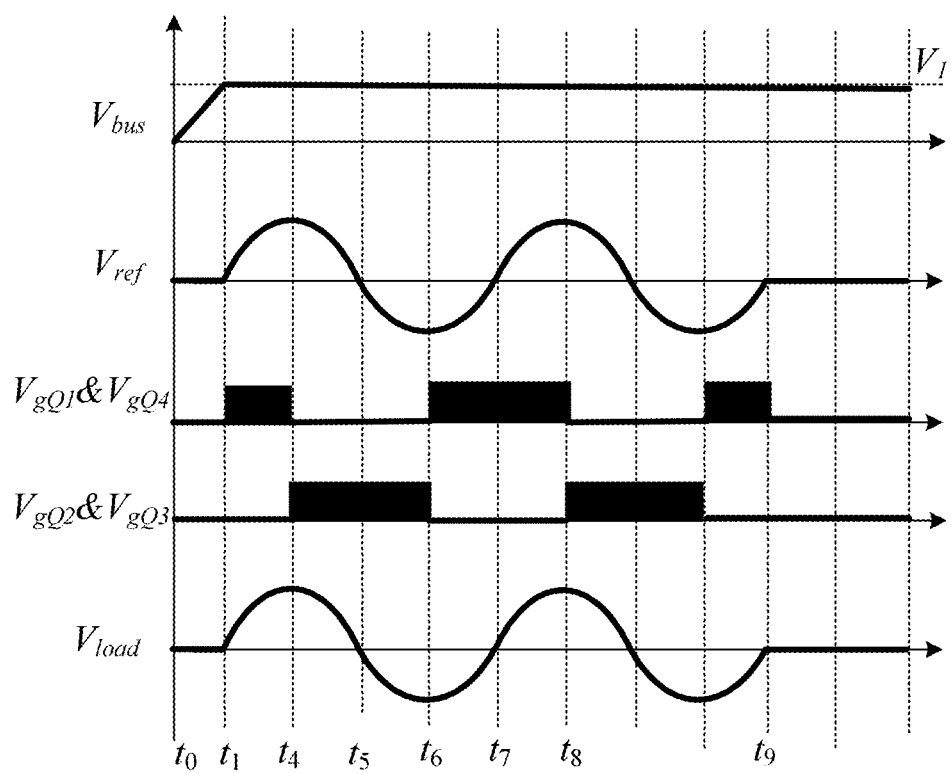
FIG. 2 is a schematic diagram showing an operating waveform of the first example driving circuit according to the embodiments of the present disclosure.

As shown in FIG. 2, the power switch $Q_b$ in the power stage circuit 1 operates in a PWM mode from a time instant $t_0$, so that the voltage $V_{bus}$ across the energy storage capacitor $C_1$ rises from zero until a time instant $t_1$ at which the voltage $V_{bus}$ across the energy storage capacitor $C_1$ reaches the first voltage $V_1$. Then, the power switch $Q_b$ in the power stage circuit 1 still operates in the PWM mode so that the voltage $V_{bus}$ across the energy storage capacitor $C_1$ maintains at the first voltage $V_1$.

At any time instant after the voltage $V_{bus}$ across the energy storage capacitor $C_1$ maintains at the first voltage $V_1$, the reference voltage is generated and the power switches in the full-bridge circuit 2 can be driven. In FIG. 2, the reference voltage is generated since the time instant $t_1$ (that is, a time instant when the voltage $V_{bus}$ across the energy storage capacitor $C_1$ reaches the first voltage $V_1$), and the power switches in the full-bridge circuit 2 are driven since the time instant $t_1$. However, the present disclosure is not limited thereto.

During an interval from the time instant $t_1$ to a time instant $t_4$, $V_{gQ2}$ and $V_{gQ3}$ are at a low level, so that the second power switch $Q_2$ and the third power switch $Q_3$ are turned off. The first power switch $Q_1$ and the fourth power switch $Q_4$ operate in a linear mode (here, black shadow is used for $V_{gQ1}$ and $V_{gQ4}$ to represent the linear mode). The equivalent driving circuit is shown in FIG. 4. During this interval, the piezoelectric load $C_{load}$ is forward charged through full-bridge circuit 2. A driving voltage for the first power switch $Q_1$ and a driving voltage for the fourth power switch $Q_4$ are controlled, so that turn-on resistance of the first power switch $Q_1$ and turn-on resistance of the fourth power switch $Q_4$ are controlled, and thereby a rate at which the piezoelectric load $C_{load}$ is charged forward is controlled. As a result, the supply voltage signal increases with the reference voltage $V_{ref}$ in this interval until the time instant $t_4$. At the time instant $t_4$, the voltage difference $V_{load}$ between two terminals of the piezoelectric load reaches a maximum of the reference voltage $V_{ref}$. During the interval from the time instant $t_1$ to the time instant $t_4$, the voltage difference $V_{load}$ between two terminals of the piezoelectric load changes as shown in FIG. 2.

During an interval from the time instant $t_4$ to a time instant $t_5$, $V_{gQ1}$ and $V_{gQ4}$ are at a low level, so that the first power switch $Q_1$ and the fourth power switch $Q_4$ are turned off. The second power switch $Q_2$ and the third power switch $Q_3$ operate in a linear mode (i.e., $V_{gQ2}$ and $V_{gQ3}$ each are represented by black shadow). The equivalent driving circuit is shown in FIG. 5. During this interval, the piezoelectric load $C_{load}$ discharges through the full-bridge circuit 2 forward. A driving voltage for the second power switch $Q_2$ and a driving voltage for the third power switch $Q_3$ are controlled, so that turn-on resistance of the second power switch $Q_2$ and turn-on resistance of the third power switch $Q_3$ are controlled and thereby a rate at which the piezoelectric load $C_{load}$ discharges forward is controlled. As a result, the supply voltage signal decreases with the reference voltage $V_{ref}$ in this interval until the time instant $t_5$. At the time instant $t_5$, the voltage difference $V_{load}$ between two terminals of the piezoelectric load $C_{load}$ decreases to zero with the reference voltage $V_{ref}$. During the interval from the time instant $t_4$ to the time instant $t_5$, the voltage difference $V_{load}$ between two terminals of the piezoelectric load changes as shown in FIG. 2.

During an interval from the time instant $t_5$ to a time instant $t_6$, $V_{gQ1}$ and $V_{gQ4}$ are at a low level, so that the first power switch $Q_1$ and the fourth power switch $Q_4$ are turned off. The second power switch $Q_2$ and the third power switch $Q_3$ operate in a linear mode. The equivalent driving circuit is shown in FIG. 5. During this interval, the piezoelectric load $C_{load}$ is reversely charged through the full-bridge circuit 2. The driving voltage for the second power switch $Q_2$ and the driving voltage for the third power switch $Q_3$ are controlled, so that the turn-on resistance of the second power switch $Q_2$ and the turn-on resistance of the third power switch $Q_3$ are controlled and thereby a rate at which the piezoelectric load $C_{load}$ is charged reversely is controlled. As a result, the supply voltage signal decreases with the reference voltage $V_{ref}$ in this interval until the time instant $t_6$. At the time instant $t_6$, the voltage difference $V_{load}$ between two terminals of the piezoelectric load decreases to a minimum of the reference voltage $V_{ref}$. During the interval from the time instant $t_5$ to the time instant $t_6$, the voltage difference $V_{load}$ between two terminals of the piezoelectric load changes as shown in FIG. 2.

During an interval from the time instant $t_6$ to a time instant $t_7$, $V_{gQ2}$ and $V_{gQ3}$ are at a low level, so that the second power switch $Q_2$ and the third power switch $Q_3$ are turned off. The first power switch $Q_1$ and the fourth power switch $Q_4$ operate in a linear mode. The equivalent driving circuit is shown in FIG. 4. During this interval, the piezoelectric load $C_{load}$ discharges through the full-bridge circuit 2 reversely. The driving voltage for the first power switch $Q_1$ and the driving voltage for the fourth power switch $Q_4$ are controlled, so that the turn-on resistance of the first power switch $Q_1$ and the turn-on resistance of the fourth power switch $Q_4$ are controlled and thereby a rate at which the piezoelectric load $C_{load}$ discharges reversely is controlled. As a result, the supply voltage signal increases with the reference voltage $V_{ref}$ in this interval until the time instant $t_7$. At the time instant $t_7$, the voltage difference $V_{load}$ between two terminals of the piezoelectric load increases to zero with the reference voltage $V_{ref}$. During the interval from the time instant $t_6$ to the time instant $t_7$, the voltage difference $V_{load}$ between two terminals of the piezoelectric load changes as shown in FIG. 2.

An interval from the time instant $t_1$ to the time instant $t_7$ is an operating cycle. The operating process during the interval from the time instant $t_1$ to the time instant $t_7$ is repeated, so that the supply voltage signal changes with the reference voltage $V_{ref}$. The waveform of the supply voltage signal is a sine wave. The repeat stops at a time instant $t_9$. Since the time instant $t_9$, the reference voltage remains zero. The first power switch $Q_1$, the fourth power switch $Q_4$, the second power switch $Q_2$, and the third power switch $Q_3$ are all turned off. The piezoelectric load $C_{load}$ is disconnected from the circuit. Therefore, the voltage difference $V_{load}$ between two terminals of the piezoelectric load is zero.

Based on the above, the first operating interval includes the interval from the time instant $t_6$ to the time instant $t_7$ and the interval from the time instant $t_1$ to the time instant $t_4$ (or an interval from the time instant $t_7$ to a time instant $t_8$). The reference voltage increases during the first operating interval. The piezoelectric load discharges through the full-bridge circuit 2 reversely during the interval from the time instant $t_6$ to the time instant $t_7$, and the piezoelectric load is charged forward through the full-bridge circuit 2 during the interval from the time instant $t_1$ to the time instant $t_4$ (or from the time instant $t_7$ to the time instant $t_8$). The second operating interval in one cycle includes the interval from the time instant $t_4$ to the time instant $t_5$ and the interval from the time instant $t_5$ to the time instant $t_6$. The reference voltage decreases during the second operating interval. The piezoelectric load discharges through the full-bridge circuit 2 forward during the interval from the time instant $t_4$ to the time instant $t_5$, and the piezoelectric load is charged reversely through the full-bridge circuit 2 during the interval from the time instant $t_5$ to the time instant $t_6$.

An operating process of the driving circuit according to the first embodiment controlled in the second control manner is illustrated with reference to FIG. 3, FIG. 4 and FIG. 5. $V_{ref}$ represents the reference voltage, whose waveform is a sine wave, $V_{gQb}$ represents a driving signal for the power switch $Q_b$ in the power stage circuit 1, $V_{gQ1}$ represents a driving signal for the first power switch $Q_1$, $V_{gQ2}$ represents a driving signal for the second power switch $Q_2$, $V_{gQ3}$ represents a driving signal for the third power switch $Q_3$, and $V_{gQ4}$ represents a driving signal for the fourth power switch $Q_4$. $V_{load}$ represents a voltage difference between two terminals of the piezoelectric load $C_{load}$ (where in this embodiment, $V_{load}$ represents a difference obtained by subtracting a voltage at a negative terminal of the piezoelectric load $C_{load}$ from a voltage at a positive terminal of the piezoelectric load $C_{load}$). The voltage difference between two terminals of the piezoelectric load $C_{load}$ characterizes the supply voltage signal.

During an interval from a time instant $t_1$ to a time instant $t_4$, $V_{gQ2}$ and $V_{gQ3}$ are at a low level, $V_{gQ1}$ and $V_{gQ4}$ are at a high level, so that the second power switch $Q_2$ and the third power switch $Q_3$ are turned off, and the first power switch $Q_1$ and the fourth power switch $Q_4$ are turned on. The equivalent driving circuit is shown in FIG. 4. During this interval, the driving signal is the output voltage of the power stage circuit 1. The power stage circuit 1 operates in a PWM mode. The piezoelectric load $C_{load}$ is charged forward through full-bridge circuit 2 and a duty cycle of the power switch $Q_b$ is controlled, so that the supply voltage signal increases with the reference voltage $V_{ref}$ in the interval until the time instant $t_4$. At the time instant $t_4$, the voltage difference $V_{load}$ between two terminals of the piezoelectric load reaches a maximum of the reference voltage $V_{ref}$. During the interval from the time instant $t_1$ to the time instant $t_4$, the voltage difference $V_{load}$ between two terminals of the piezoelectric load changes as shown in FIG. 3.

During an interval from the time instant $t_4$ to a time instant $t_5$, $V_{gQ1}$ and $V_{gQ4}$ are at a low level, so that the first power switch $Q_1$ and the fourth power switch $Q_4$ are turned off. The second power switch $Q_2$ and the third power switch $Q_3$ operate in a linear mode (i.e., $V_{gQ2}$ and $V_{gQ3}$ are each represented by black shadow). The equivalent driving circuit is shown in FIG. 5. During this interval, the power stage circuit 1 does not operate, that is, the power switch $Q_b$ is turned off. The piezoelectric load $C_{load}$ discharges through the full-bridge circuit 2 forward. A driving voltage for the second power switch $Q_2$ and a driving voltage for the third power switch $Q_3$ are controlled, so that turn-on resistance of the second power switch $Q_2$ and turn-on resistance of the third power switch $Q_3$ are controlled and thereby a rate at which the piezoelectric load $C_{load}$ discharges forward is controlled. As a result, the supply voltage signal decreases with the reference voltage $V_{ref}$ in this interval until the time instant $t_5$. At the time instant $t_5$, the voltage difference $V_{load}$ between two terminals of the piezoelectric load decreases to zero with the reference voltage $V_{ref}$. During the interval from the time instant $t_4$ to the time instant $t_5$, the voltage difference $V_{load}$ between two terminals of the piezoelectric load changes as shown in FIG. 3.

During an interval from the time instant $t_5$ to a time instant $t_6$, $V_{gQ1}$ and $V_{gQ4}$ are at a low level, $V_{gQ2}$ and $V_{gQ3}$ are at a high level, so that the first power switch $Q_1$ and the fourth power switch $Q_4$ are turned off, and the second power switch $Q_2$ and the third power switch $Q_3$ are turned on. The equivalent driving circuit is shown in FIG. 5. During this interval, the driving signal is the output voltage of the power stage circuit 1. The power stage circuit 1 operates in a PWM mode. The piezoelectric load $C_{load}$ is charged reversely through the full-bridge circuit 2 and the duty cycle of the power switch $Q_b$ is controlled so that the supply voltage signal decreases with the reference voltage $V_{ref}$ in the interval until the time instant $t_6$. At the time instant $t_6$, the voltage difference $V_{load}$ between two terminals of the piezoelectric load reaches the minimum of the reference voltage $V_{ref}$. During the interval from the time instant $t_5$ to the time instant $t_6$, the voltage difference $V_{load}$ between two terminals of the piezoelectric load changes as shown in FIG. 3.

During an interval from the time instant $t_6$ to a time instant $t_7$, $V_{gQ2}$ and $V_{gQ3}$ are at a low level, so that the second power switch $Q_2$ and the third power switch $Q_3$ are turned off. The first power switch $Q_1$ and the fourth power switch $Q_4$ operate in a linear mode (i.e., $V_{gQ1}$ and $V_{gQ4}$ are each represented by black shadows). The equivalent driving circuit is shown in FIG. 4. During this interval, the power stage circuit 1 does not operate, that is, the power switch $Q_b$ is turned off. The piezoelectric load $C_{load}$ discharges through the full-bridge circuit 2 reversely. The driving voltage for the first power switch $Q_1$ and the driving voltage for the fourth power switch $Q_4$ are controlled, so that the turn-on resistance of the first power switch $Q_1$ and the turn-on resistance of the fourth power switch $Q_4$ are controlled and thereby a rate at which the piezoelectric load $C_{load}$ discharges reversely is controlled. As a result, the supply voltage signal increases with the reference voltage $V_{ref}$ in this interval until the time instant $t_7$. At the time instant $t_7$, the voltage difference $V_{load}$ between two terminals of the piezoelectric load increases to zero with the reference voltage $V_{ref}$. During the interval from the time instant $t_6$ to the time instant $t_7$, the voltage difference $V_{load}$ between two terminals of the piezoelectric load changes as shown in FIG. 3.

An interval from the time instant $t_1$ to the time instant $t_7$ is an operating cycle. The operating process during the interval from the time instant $t_1$ to the time instant $t_7$ is repeated, so that the supply voltage signal changes with the reference voltage $V_{ref}$. The waveform of the supply voltage signal is a sine wave. The repeat stops at a time instant $t_9$. Since the time instant $t_9$, the reference voltage remains zero, the first power switch $Q_1$, the fourth power switch $Q_4$, the second power switch $Q_2$, and the third power switch $Q_3$ are all turned off, and the piezoelectric load $C_{load}$ is disconnected from the circuit. Therefore, the voltage difference $V_{load}$ between two terminals of the piezoelectric load is zero.

Based on the above, the first operating interval includes the interval from the time instant $t_6$ to the time instant $t_7$ and the interval from the time instant $t_1$ to the time instant $t_4$ (or an interval from the time instant $t_7$ to a time instant $t_8$). The reference voltage increases during the first operating interval. The piezoelectric load discharges through the full-bridge circuit 2 reversely during the interval from the time instant $t_6$ to the time instant $t_7$, and the piezoelectric load is charged through the full-bridge circuit 2 forward during the interval from the time instant $t_1$ to the time instant $t_4$ (or from the time instant $t_7$ to the time instant $t_8$). The second operating interval in one cycle includes the interval from the time instant $t_4$ to the time instant $t_5$ and the interval from the time instant $t_5$ to the time instant $t_6$. The reference voltage decreases during the second operating interval. The piezoelectric load discharges through the full-bridge circuit 2 forward during the interval from the time instant $t_4$ to the time instant $t_5$, and the piezoelectric load is charged through the full-bridge circuit 2 reversely during the interval from the time instant $t_5$ to the time instant $t_6$. In addition, when charging (forward and reversely) the piezoelectric load, power switches in a charging path are turned on. The duty cycle of the power switch $Q_b$ in the power stage circuit 1 is controlled, so that the supply voltage signal changes with the reference voltage in a corresponding interval. When the piezoelectric load discharges (forward and reversely), power switches in a discharging path are controlled to operate in a linear mode. The turn-on resistance of the corresponding power switch in the discharging path is controlled by controlling the driving voltage for the corresponding power switch, so that the supply voltage signal changes with the reference voltage in the corresponding interval.

Figure 3:
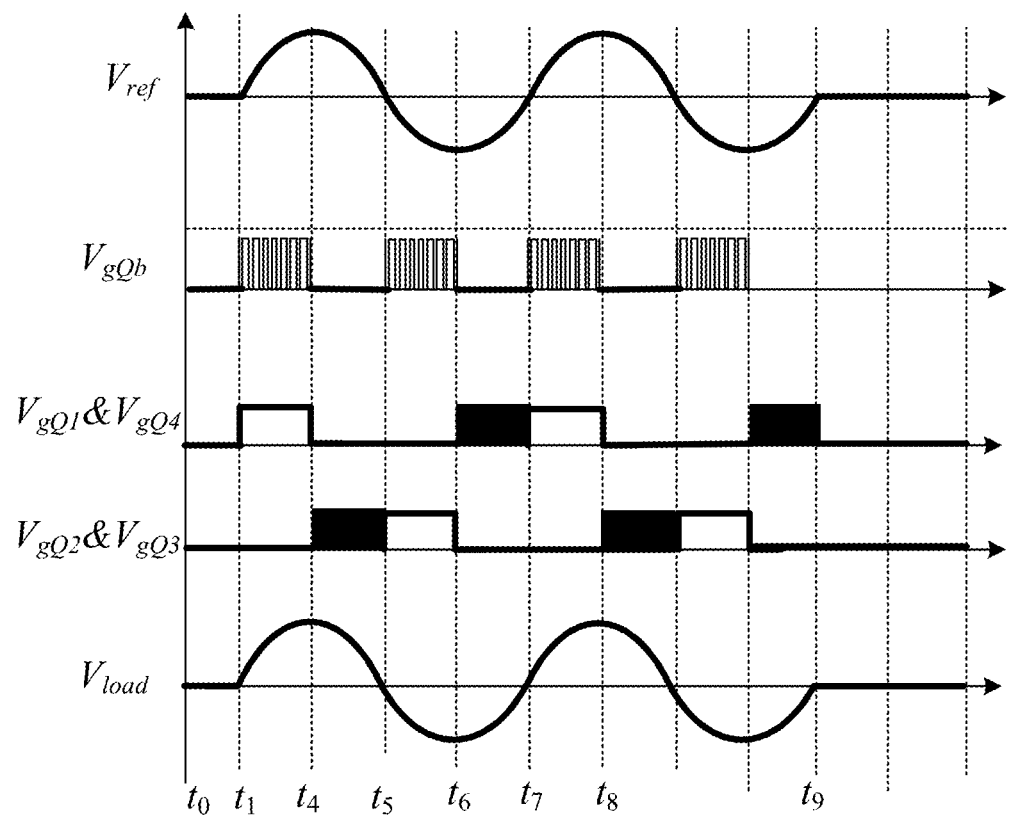
FIG. 3 is a schematic diagram showing another operating waveform of the first example driving circuit according to the embodiments of the present disclosure.

It should be noted that the black shadows in FIG. 2 and FIG. 3 are only used to indicate that the power switch operates in the linear mode, rather than indicate an actual driving voltage for driving the power switch to operate in the linear mode. Specifically, the driving voltage for driving the power switch to operate in the linear mode changes with a compensation signal. The compensation signal indicates an error between the reference voltage and a sampling signal characterizing the supply voltage signal. Moreover, an initial value of the driving voltage may be zero or another preset value.

Figure 6:
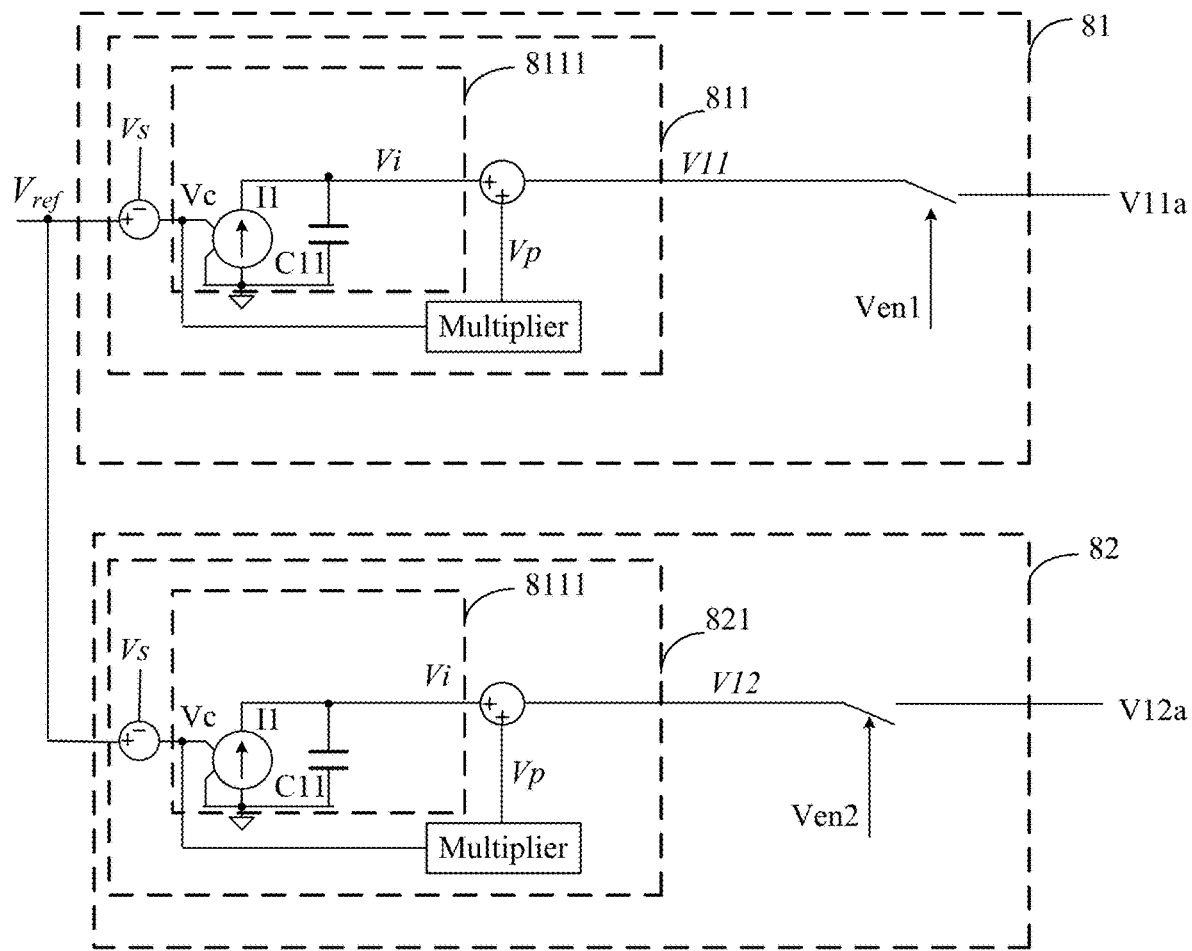
FIG. 6 is a schematic diagram showing a control circuit of the first example driving circuit according to the embodiments of the present disclosure.

FIG. 6 is a schematic diagram showing a control circuit of the first example driving circuit according to the embodiments of the present disclosure. The control circuit corresponds to the first control manner. The control circuit includes a first control circuit 81 configured to generate a first driving voltage V11a based on a compensation signal Vc, and a second control circuit 82 configured to generate a second driving voltage V12a based on the compensation signal Vc. The first driving voltage V11a is outputted to a control terminal of the first power switch $Q_1$ and a control terminal of the fourth power switch $Q_4$, for controlling an operating mode (that is, the linear mode or turned-off) of each of the first power switch $Q_1$ and the fourth power switch $Q_4$. The second driving voltage V12a is outputted to a control terminal of the second power switch $Q_2$ and a control terminal of the third power switch $Q_3$, for controlling the operating mode (that is, the linear mode or turned-off) of each of the second power switch $Q_2$ and the third power switch $Q_3$. The compensation signal Vc indicates an error between the reference voltage $V_{ref}$ and a sampling signal Vs characterizing the supply voltage signal. The control circuit is further configured to control a switching mode of the power switch $Q_b$ in the power stage circuit 1. Any conventional control manner is applicable to the power switch $Q_b$, which is not described in detail herein.

Specifically, during the first operating interval, the first control circuit 81 generates the first driving voltage V11a based on the compensation signal Vc, to control the turn-on resistance of the first power switch $Q_1$ and the turn-on resistance of the fourth power switch $Q_4$. The second control circuit 82 controls the second driving voltage V12a to be invalid, so as to control the second power switch $Q_2$ and the third power switch $Q_3$ to be turned off. During the second operating interval, the first control circuit 81 controls the first driving voltage V11a to be invalid, so as to control the first power switch $Q_1$ and the fourth power switch $Q_4$ to be turned off. The second control circuit 82 generates the second driving voltage V12a based on the compensation signal Vc, to control the turn-on resistance of the second power switch $Q_2$ and the turn-on resistance of the third power switch $Q_3$.

The first control circuit 81 includes a first signal generating circuit 811. The first signal generating circuit 811 is configured to generate a first signal V11 based on the compensation signal Vc. The first signal V11 serves as the first driving voltage V11a when a first enable signal Ven1 is valid. In an embodiment, the first driving voltage V11a is zero when the first enable signal Ven1 is invalid.

The first enable signal Ven1 is valid when the reference voltage increases or a slope of the waveform of the reference voltage is greater than zero (that is, during the first operating interval).

The second control circuit 82 includes a second signal generating circuit 821. The second signal generating circuit 821 is configured to generate a second signal V12 based on the compensation signal Vc. The second signal V12 serves as the second driving voltage V12a when a second enable signal Ven2 is valid. In an embodiment, the second driving voltage V12a is zero when the second enable signal Ven2 is invalid.

The second enable signal Ven2 is valid when the reference voltage decreases or the slope of the waveform of the reference voltage is less than zero (that is, during the second operating interval).

Each of the first signal generating circuit 811 and the second signal generating circuit 821 includes an integrating circuit 8111 and a multiplier. The integrating circuit 8111 and the multiplier both are configured to receive the compensation signal Vc. The first signal V11 or the second signal V12 is obtained by adding an output signal Vi from the integrating circuit 8111 and an output signal Vp from the multiplier. The compensation signal Vc indicates an error between the reference voltage $V_{ref}$ and a sampling signal Vs characterizing the supply voltage signal.

The integrating circuit 8111 includes a voltage-controlled current source I1 and a capacitor C11. The voltage-controlled current source I1 is configured to receive the compensation signal Vc, and output a current to charge the capacitor C11. A voltage across the capacitor C11 serves as the output signal Vi from the integrating circuit 8111.

In another embodiment, the control circuit according to the first embodiment of the present disclosure is in other forms or has other structures. For example, the control circuit includes four control sub-circuits to generate four driving voltages so as to drive the first power switch $Q_1$, the fourth power switch $Q_4$, the second power switch $Q_2$, and the third power switch $Q_3$, respectively, which is not limited herein.

The driving circuit according to the first embodiment of the present disclosure is configured to drive one piezoelectric load, and therefore includes only one voltage output circuit, which is referred to as a single output. The driving circuit according to the present disclosure is further configured to drive multiple piezoelectric loads, that is, including multiple outputs. Specifically, the driving circuit includes at least two full-bridge circuits connected in parallel with each other. The operating modes of the full-bridge circuits are controlled to provide supply voltage signals to piezoelectric loads so as to drive the piezoelectric loads, respectively. For ease of description in the subsequent embodiments of the present disclosure, two outputs for driving two piezoelectric loads are taken as an example. However, the present disclosure is not limited thereto.

Figure 7:
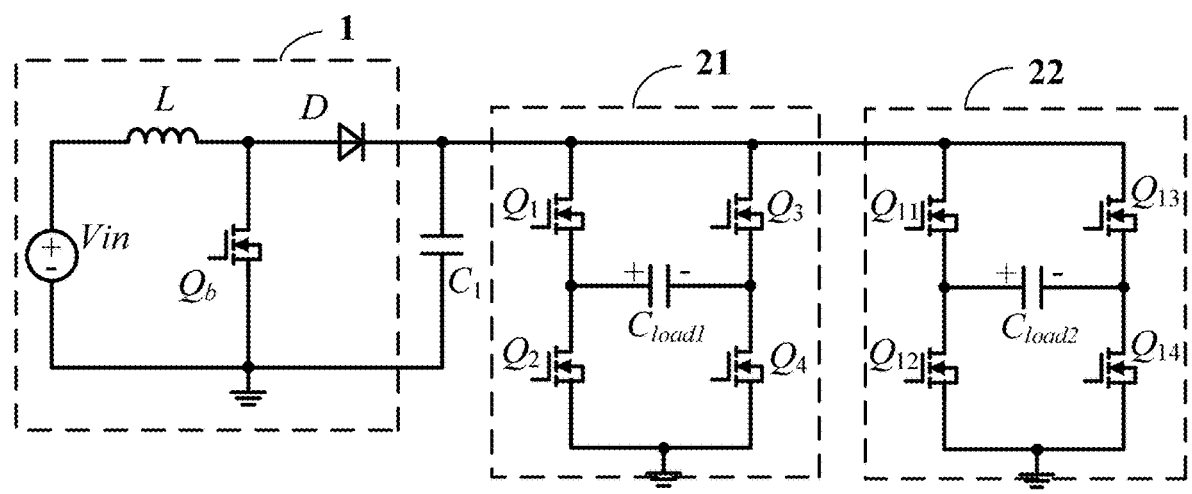
FIG. 7 is a schematic diagram showing a second example driving circuit according to the embodiments of the present disclosure.

FIG. 7 is a schematic diagram showing a second example driving circuit according to the embodiments of the present disclosure. The second example driving circuit is different from the first example driving circuit described above in that: the driving circuit in this example includes two full-bridge circuits which are connected in parallel between the two terminals of the output port of the power stage circuit 1. Operating modes of the two full-bridge circuits are controlled to generate a first supply voltage signal and a second supply voltage signal so as to drive a piezoelectric load $C_{load1}$ and a piezoelectric load $C_{load2}$, respectively.

The driving circuit includes a full-bridge circuit 21 and a full-bridge circuit 22. The full-bridge circuit 21 and the full-bridge circuit 22 are connected in parallel between two terminals of the output port of the power stage circuit 1.

The full-bridge circuit 21 includes a power switch $Q_1$, a power switch $Q_2$, a power switch $Q_3$, and a power switch $Q_4$. The power switch $Q_1$ and the power switch $Q_2$ are connected in series between two terminals of the output port of the power stage circuit 1. The power switch $Q_3$ and the power switch $Q_4$ are connected in series between two terminals of the output port of the power stage circuit 1. The piezoelectric load $C_{load1}$ is connected between a first node and a second node, where the first node is a common terminal of the power switch $Q_1$ and the power switch $Q_2$, and the second node is a common terminal of the power switch $Q_3$ and the power switch $Q_4$. The full-bridge circuit 22 includes a power switch $Q_{11}$, a power switch $Q_{12}$, a power switch $Q_{13}$, and a power switch $Q_{14}$. The power switch $Q_{11}$ and the power switch $Q_{12}$ are connected in series between two terminals of the output port of the power stage circuit 1. The power switch $Q_{13}$ and the power switch $Q_{14}$ are connected in series between two terminals of the output port of the power stage circuit 1. The piezoelectric load $C_{load2}$ is connected between a third node and a fourth node, where the third node is a common terminal of the power switch $Q_{11}$ and the power switch $Q_{12}$, and the fourth node is a common terminal of the power switch $Q_{13}$ and the power switch $Q_{14}$.

Any of the first control manner and the second control manner described in the first embodiment is applicable to the second embodiment. The piezoelectric load $C_{load1}$ and the piezoelectric load $C_{load2}$ are driven simultaneously or separately. In a case where the first control manner is applied and the two piezoelectric loads are driven separately, an operating process and control principle in the second embodiment are similar to those for driving a single piezoelectric load in the first embodiment, and therefore are not described in detail hereinafter. In a case where the two piezoelectric loads are driven simultaneously, the first voltage V1 outputted by the power stage circuit 1 does not change with voltages across the piezoelectric loads and the number of the piezoelectric loads. Therefore, the two full-bridge circuits in the second embodiment are independent from each other, that is, the full-bridge circuit 21 for driving the piezoelectric load $C_{load1}$ and the full-bridge circuit 22 for driving the piezoelectric load $C_{load22}$ are controlled separately. In other words, the operating mode of the full-bridge circuit 21 is controlled to generate the first supply voltage signal to drive the piezoelectric load $C_{load1}$, and the operating mode of the full-bridge circuit 22 is controlled to generate the second supply voltage signal to drive the piezoelectric load $C_{load2}$.

In a case where the second control manner is applied and the two piezoelectric loads are driven separately, an operating process and control principle in the second embodiment are similar to those for driving a single piezoelectric load in the first embodiment, and therefore are not described in detail hereinafter. In a case where the two piezoelectric loads are driven simultaneously, when charging (forward or reversely) the piezoelectric load $C_{load1}$ and/or the piezoelectric load $C_{load2}$, the power stage circuit 1 is shared for charging. That is, the first supply voltage signal for driving the piezoelectric load $C_{load1}$ and the second supply voltage signal for driving the piezoelectric load $C_{load2}$ both are implemented by the output voltage of the power stage circuit 1. When discharging (forward or reversely) the piezoelectric load $C_{load1}$ and the piezoelectric load $C_{load2}$, the two full-bridge circuits are controlled separately. In other words, the operating mode of the full-bridge circuit 21 is controlled to generate the first supply voltage signal to drive the piezoelectric load $C_{load1}$, and the operating mode of the full-bridge circuit 22 is controlled to generate the second supply voltage signal to drive the piezoelectric load $C_{load2}$.

A driving method is further provided according to the present disclosure. The driving method is applicable to a driving circuit. The driving circuit includes a power stage circuit and a full-bridge circuit. The power stage circuit receives an input voltage, and generates an output voltage at an output port of the power stage circuit. The full-bridge circuit is coupled to the output port of the power stage circuit for charging and discharging a piezoelectric load. The driving method includes: controlling an operating mode of the full-bridge circuit, so that a supply voltage signal generated by the full-bridge circuit for driving the piezoelectric load during a first operating interval of an operating cycle corresponds to a reference voltage in a first interval, and the supply voltage signal generated during a second operating interval of the operating cycle corresponds to the reference voltage in a second interval. In an embodiment, the reference voltage is an alternating current voltage.

Further, the piezoelectric load discharges through the full-bridge circuit reversely during a part of the first operating interval, and the piezoelectric load is charged through the full-bridge circuit forward during another part of the first operating interval. In an embodiment, the piezoelectric load discharges through the full-bridge circuit forward during a part of the second operating interval, and the piezoelectric load is charged through the full-bridge circuit reversely during another part of the second operating interval.

Further, the reference voltage in the first interval is a rising part of the reference voltage in a cycle, and the reference voltage in the second interval is a falling part of the reference voltage in the cycle. In an embodiment, a waveform of the reference voltage is a sine wave.

Although the above embodiments are described and explained separately, there are some common technologies between different embodiments. Those skilled in the art may replace and integrate these embodiments. For details not clearly described in an embodiment, one may refer to another embodiment in which these details are described.

The embodiments of the present disclosure are described above. Not all details are described in the embodiments, and the present disclosure is not limited to the described embodiments. Apparently, numerous modifications and variations may be made based on the above descriptions. The embodiments are selected and described in the specification in order to explain the principle and practical applications of the present disclosure well, so that those skilled in the art can make good use of the present disclosure and make modifications based on the present disclosure. The present disclosure is limited only by the claims, full scope and equivalents thereof.

The invention claimed is:

1. A driving circuit for driving a piezoelectric load, comprising:
   a power stage circuit configured to receive an input voltage, and generate an output voltage at an output port of the power stage circuit; and
   a full-bridge circuit coupled to the output port of the power stage circuit, and configured to perform charging and discharging on the piezoelectric load coupled to an output port of the full-bridge circuit,
   wherein an operating mode of the full-bridge circuit is controlled, so that a supply voltage signal generated by the full-bridge circuit for driving the piezoelectric load during a first operating interval of an operating cycle corresponds to a reference voltage in a first interval, and the supply voltage signal generated during a second operating interval of the operating cycle corresponds to the reference voltage in a second interval, wherein the reference voltage in the first interval is a rising part of the reference voltage in a cycle, and the reference voltage in the second interval is a falling part of the reference voltage in the cycle.

2. The driving circuit according to claim 1, wherein
   the piezoelectric load discharges through the full-bridge circuit reversely during a part of the first operating interval, and the piezoelectric load is charged through the full-bridge circuit forward during another part of the first operating interval; and
   the piezoelectric load discharges through the full-bridge circuit forward during a part of the second operating interval, and the piezoelectric load is charged through the full-bridge circuit reversely during another part of the second operating interval.

3. The driving circuit according to claim 1, wherein the full-bridge circuit comprises a first power switch, a second power switch, a third power switch, and a fourth power switch, wherein
   the first power switch and the second power switch are connected in series between two terminals of the output port of the power stage circuit,
   the third power switch and the fourth power switch are connected in series between the two terminals of the output port of the power stage circuit, and
   the piezoelectric load is connected between a first node and a second node of the output port of the full-bridge circuit, wherein the first node is a common terminal of the first power switch and the second power switch, and the second node is a common terminal of the third power switch and the fourth power switch.

4. The driving circuit according to claim 3, wherein
   during the first or the second operating interval, the first to fourth power switches are controlled to operate in one of a turn-off state and a linear mode, so that the supply voltage signal corresponds to the reference voltage.

5. The driving circuit according to claim 4, wherein
   during the first operating interval, the second power switch and the third power switch are controlled to be turned off, and the first power switch and the fourth power switch are controlled to operate in a linear mode, so that the supply voltage signal corresponds to the reference voltage in the first interval;
   during the second operating interval, the first power switch and the fourth power switch are controlled to be turned off, and the second power switch and the third power switch are controlled to operate in a linear mode, so that the supply voltage signal corresponds to the reference voltage in the second interval.

6. The driving circuit according to claim 5, wherein an operating mode of the power stage circuit is controlled during the first operating interval and the second operating interval, so that the output voltage of the power stage circuit maintains at a first voltage.

7. The driving circuit according to claim 3, wherein
   during a first part of the first or the second operating interval, the first to fourth power switches are controlled to operate in one of a turn-off state and a linear mode; and during a second part of the first or the second operating interval, the first to fourth power switches are controlled to be turned on or off.

8. The driving circuit according to claim 7, wherein
   during the first part of the first operating interval, the second power switch and the third power switch are controlled to be turned off, and the first power switch and the fourth power switch are controlled to operate in a linear mode; and during the second part of the first operating interval, the second power switch and the third power switch are controlled to be turned off, and the first power switch and the fourth power switch are controlled to be turned on, wherein the supply voltage signal during the first operating interval corresponds to the reference voltage in the first interval;
   during the first part of the second operating interval, the first power switch and the fourth power switch are controlled to be turned off, and the second power switch and the third power switch are controlled to operate in a linear mode; and during the second part of the second operating interval, the first power switch and the fourth power switch are controlled to be turned off, and the second power switch and the third power switch are controlled to be turned on, wherein the supply voltage signal during the second operating interval corresponds to the reference voltage in the second interval.

9. The driving circuit according to claim 7, wherein an operating mode of the power stage circuit is controlled during the second part of the first operating interval and the second part of the second operating interval, wherein the output voltage of the power stage circuit serves as the supply voltage signal.

10. The driving circuit according to claim 1, wherein the reference voltage is an alternating current voltage, and a waveform of the reference voltage is a sine wave.

11. The driving circuit according to claim 1, further comprising an energy storage capacitor, wherein the energy storage capacitor is coupled to the output port of the power stage circuit and is configured to store the output voltage of the power stage circuit.

12. The driving circuit according to claim 1, wherein the number of the full-bridge circuit is N, wherein
the N full-bridge circuits are connected in parallel with each other and are connected to the output port of the power stage circuit, and the N full-bridge circuits are configured to provide supply voltage signals for N piezoelectric loads respectively, wherein N is greater than or equal to 1.

13. The driving circuit according to claim 3, further comprising a control circuit, wherein
the control circuit is configured to generate a first driving voltage and a second driving voltage based on a compensation signal, to control the operating modes of the first power switch, the second power switch, the third power switch, and the fourth power switch, wherein the compensation signal indicates an error between the reference signal and a sampling signal characterizing the supply voltage signal.

14. The driving circuit according to claim 13, wherein the control circuit comprises:
a first control circuit configured to generate the first driving voltage; and
a second control circuit configured to generate the second driving voltage, wherein
during the first operating interval, the first control circuit generates the first driving voltage based on the compensation signal, to control turn-on resistance of the first power switch and turn-on resistance of the fourth power switch, and the second control circuit controls the second driving voltage to be invalid, to control the second power switch and the third power switch to be turned off; and
during the second operating interval, the first control circuit controls the first driving voltage to be invalid, to control the first power switch and the fourth power switch to be turned off, and the second control circuit generates the second driving voltage based on the compensation signal, to control turn-on resistance of the second power switch and turn-on resistance of the third power switch.

15. The driving circuit according to claim 1, wherein the power stage circuit is one of a buck circuit, a boost circuit, a flyback circuit, a forward circuit, a boost-buck circuit, and a buck-boost circuit.

16. A driving method applicable to a driving circuit, wherein the driving circuit comprises:
a power stage circuit for receiving an input voltage, and generating an output voltage at an output port of the power stage circuit; and a full-bridge circuit coupled to the output end of the power stage circuit and for performing charging and discharging on a piezoelectric load coupled to an output port of the full-bridge circuit;
and wherein the driving method comprises:
controlling an operating mode of the full-bridge circuit to control:
a supply voltage signal generated by the full-bridge circuit for driving the piezoelectric load during a first operating interval of an operating cycle to correspond to a reference voltage in a first interval; and
the supply voltage signal generated during a second operating interval of the operating cycle to correspond to the reference in a second interval; and
during the first or the second operating interval, controlling first to fourth power switches in the full-bridge circuit to operate in one of a turn-off state and a linear mode, so that the supply voltage signal corresponds to the reference voltage.

17. The driving method according to claim 16, further comprising:
during the first operating interval, controlling the second power switch and the third power switch to be turned off, and controlling the first power switch and the fourth power switch to operate in a linear mode, so that the supply voltage signal corresponds to the reference voltage in the first interval;
during the second operating interval, controlling the first power switch and the fourth power switch to be turned off, and controlling the second power switch and the third power switch to operate in a linear mode, so that the supply voltage signal corresponds to the reference voltage in the second interval.

18. The driving method according to claim 16, further comprising:
controlling an operating mode of the power stage circuit during the first operating interval and the second operating interval, to maintain the output voltage of the power stage circuit to maintain at a first voltage.

19. A driving method applicable to a driving circuit, wherein the driving circuit comprises:
a power stage circuit for receiving an input voltage, and generating an output voltage at an output port of the power stage circuit; and
a full-bridge circuit coupled to the output end of the power stage circuit and for performing charging and discharging on a piezoelectric load coupled to an output port of the full-bridge circuit;
and wherein the driving method comprises:
controlling an operating mode of the full-bridge circuit to control:
a supply voltage signal generated by the full-bridge circuit for driving the piezoelectric load during a first operating interval of an operating cycle to correspond to a reference voltage in a first interval; and
the supply voltage signal generated during a second operating interval of the operating cycle to correspond to the reference in a second interval; and
during a first part of the first or the second operating interval, controlling first to fourth power switches in the full-bridge circuit to operate in one of a turn-off state and a linear mode; and during a second part of the first or the second operating interval, controlling the first to fourth power switches to be turned on or off.

20. The driving method according to claim 19, further comprising:

during the first part of the first operating interval, controlling the second power switch and the third power switch to be turned off, and controlling the first power switch and the fourth power switch to operate in a linear mode; and during the second part of the first operating interval, controlling the second power switch and the third power switch to be turned off, and controlling the first power switch and the fourth power switch to be turned on, such that the supply voltage signal during the first operating interval corresponds to the reference voltage in the first interval;

during the first part of the second operating interval, controlling the first power switch and the fourth power switch to be turned off, and controlling the second power switch and the third power switch to operate in a linear mode; and during the second part of the second operating interval, controlling the first power switch and the fourth power switch to be turned off, and controlling the second power switch and the third power switch to be turned on, such that the supply voltage signal during the second operating interval corresponds to the reference voltage in the second interval.

21. The driving method according to claim 19, further comprising:

controlling an operating mode of the power stage circuit during the second part of the first operating interval and the second part of the second operating interval, wherein the output voltage of the power stage circuit serves as the supply voltage signal.

* * * * *